US007432038B2

(12) United States Patent
Maruyama et al.

(10) Patent No.: US 7,432,038 B2
(45) Date of Patent: Oct. 7, 2008

(54) DIELECTRIC LINE AND PRODUCTION METHOD THEREFOR

(75) Inventors: Masakatsu Maruyama, Kobe (JP); Nobuyuki Kawakami, Kobe (JP); Yoshito Fukumoto, Kobe (JP); Takayuki Hirano, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 266 days.

(21) Appl. No.: 10/543,135

(22) PCT Filed: Jan. 5, 2004

(86) PCT No.: PCT/JP2004/000012

§ 371 (c)(1),
(2), (4) Date: Jul. 25, 2005

(87) PCT Pub. No.: WO2004/068628

PCT Pub. Date: Aug. 12, 2004

(65) Prior Publication Data

US 2006/0102937 A1 May 18, 2006

(30) Foreign Application Priority Data

Jan. 28, 2003 (JP) ............................ 2003-019344

(51) Int. Cl.
*G03F 7/20* (2006.01)
*G03F 7/26* (2006.01)

(52) U.S. Cl. ....................................... 430/311; 430/322

(58) Field of Classification Search ................. 430/311, 430/270.1, 322
See application file for complete search history.

(56) References Cited

U.S. PATENT DOCUMENTS 6,800,360 B2 10/2004 Miyanaga et al.

(Continued)

FOREIGN PATENT DOCUMENTS

DE 689 12 043 T 2 8/1988

(Continued)

OTHER PUBLICATIONS

International Search Report from PCT/JP2004/000012 dated Jun. 1, 2004.

*Primary Examiner*—Mark F. Huff
*Assistant Examiner*—Brittany Raymond
(74) *Attorney, Agent, or Firm*—Reed Smith LLP; Stanley P. Fisher, Esq.; Juan Carlos A. Marquez, Esq.

(57) ABSTRACT

A dielectric line having a sufficient ensured strength and being suitable for mass production and a production method therefor are provided. The production method is a method for manufacturing a dielectric line having a dielectric strip which is provided between two conductive plates approximately parallel to each other and which has a width smaller than that of the conductive plates, and dielectric medium layers which are filled between the conductive plates other than the dielectric strip and which is composed of a porous material having a dielectric constant smaller than that of the dielectric strip. The dielectric line (NRD guide) is produced by film forming steps S11 and S12 in which a film of a dielectric raw material is formed on one of the conductive plates, a strip exposure step S13 in which a part of the above film having a shape corresponding to the dielectric strip is exposed to predetermined light, beams, or vapor, and pore forming steps S15 and S16 in which the entire film of the dielectric raw material is made porous.

13 Claims, 6 Drawing Sheets

U.S. PATENT DOCUMENTS 6,803,171 B2 * 10/2004 Gronbeck et al. ........ 430/270.1

FOREIGN PATENT DOCUMENTS

| | | | |
|---|---|---|---|
| EP | 0 360 415 | A1 | 8/1989 |
| GB | 2 222 314 | A | 8/1989 |
| JP | 01-51202 | | 6/1982 |
| JP | 02-54602 | | 8/1988 |
| JP | 03-270401 | | 3/1990 |
| JP | 06-45807 | | 7/1992 |
| JP | 06-260814 | | 3/1993 |
| JP | 08-65015 | | 8/1994 |
| JP | 08-228105 | | 2/1995 |
| JP | 11-27010 | | 6/1997 |
| JP | 2001-7611 | | 6/1999 |
| JP | 2002-76717 | | 9/2000 |
| JP | 2001-237617 | | 12/2000 |
| JP | 2003-89585 | | 9/2001 |
| JP | 2002-308678 | | 1/2002 |
| JP | 2003-115705 | | 1/2002 |
| WO | WO 02/62727 | A1 | 2/2002 |

* cited by examiner

PRIOR ART

DIELECTRIC LINE AND PRODUCTION METHOD THEREFOR

TECHNICAL FIELD

The present invention relates a dielectric line and a production method therefor, the dielectric line having superior strength properties and transmission properties of high frequency signals and being suitable for mass production.

BACKGROUND ART

Heretofore, for integrated circuits which require transmission of high frequency signals in a millimeter wave band, microstrip lines, dielectric lines, and waveguide lines, and the like have been used. In particular, since a nonradiative dielectric line (NRD guide), which is one type of dielectric line and has been disclosed in Japanese Examined Patent Application Publication No. 1-51202, can suppress radiation loss of energy, superior transmission properties of high frequency signals can be obtained.

FIG. 7 shows the structure of a general NRD guide 10. The conventional and general NRD guide 10 has the structure in which two conductive plates 1 and 2 approximately parallel to each other sandwich a dielectric strip 4 having a width smaller than that of the conductive plates 1 and 2. Parts 3 between the two conductive plates 1 and 2 other than the dielectric strip 4 are voids (air). As described above, in the conventional NRD guide 10, since the width of the dielectric strip 4 is smaller than the width of the conductive plates 1 and 2, and the contact area therebetween is small, when the NRD guide 10 is handled, it is difficult to ensure the strength to retain the structure described above. Techniques for ensuring the strength of the NRD guide 10 have been disclosed in Japanese Unexamined Patent Application Publication Nos. 3-270401, 6-45807, and 8-65015.

For example, in Japanese Unexamined Patent Application Publication No. 3-270401, in order to increase the contact area between the conductive plate and the dielectric strip, a technique has been disclosed in which the dielectric strip is formed to have an H-shaped cross-section. In addition, in Japanese Unexamined Patent Application Publication No. 6-45807, a technique in which dams are provided for the conductive plates along the dielectric strip has been disclosed; and in Japanese Unexamined Patent Application Publication No. 8-65015, a technique has been disclosed in which projections are provided on a surface of the dielectric strip to be bonded to the conductive plate and are then buried therein. Accordingly, when the dielectric strip and the conductive plate are bonded to each other, the alignment can be easily performed, and the displacement of the bonding portion can be prevented.

In addition, in Japanese Unexamined Patent Application Publication No. 6-260814, a technique has been disclosed in which in order to improve the productivity of the NRD guides, top-half parts and bottom-half parts are produced separately and are then assembled into the NRD guides, and in Japanese Unexamined Patent Application Publication No. 2001-7611, a technique has been disclosed in which as a method suitably used for mass production of the NRD guides, a resist process is used.

However, according to the conventional structures and production methods of the NRD guides described above, various machining steps must be performed for the conductive plates and the dielectric strip, and as a result, there has been a problem in that those mentioned above cannot be suitably applied to mass production.

In addition, there has been a limit to ensure the strength by the bonding portions between the two conductive plates and the dielectric strip, and hence there has been a problem in that a sufficient strength cannot be obtained.

Hence, the present invention was made in consideration of the situations described above, and an object of the present invention is to provide a dielectric line and a production method therefor, the dielectric line capable of ensuring a sufficient strength and being suitable for mass production.

DISCLOSURE OF INVENTION

In order to achieve the object described above, the present invention provides a dielectric line which has a dielectric strip provided between two conductive plates approximately parallel to each other and having a width smaller than that of the conductive plates. In this dielectric line described above, the dielectric strip is composed of a porous material, and the other parts between the two conductive plates other than the dielectric strip are filled with dielectric medium layers composed of a porous material having a dielectric constant smaller than that of the dielectric strip.

In the dielectric line described above, the dielectric constant of the dielectric strip is preferably 1.5 times or more the dielectric constant of the dielectric medium layer.

By the structure as described above, since the dielectric strip and the dielectric medium layers are filled between the two conductive plates, compared to a conventional dielectric line (see FIG. 7) in which the parts other than the dielectric strip are voids (air), the dielectric strip is unlikely to be displaced, and as a result, the strength is significantly increased, thereby forming a stable structure.

In addition, since the porous materials are used for the dielectric strip and the dielectric medium layers, by increasing the porosity thereof, the dielectric constant and the dielectric loss can be significantly decreased, and as a result, high frequency signals can be transmitted with very high transmission efficiency (low loss).

In addition, the case may also be considered in which the dielectric strip and the dielectric medium layers are formed of a substantially identical material and have different porosities from each other. In this case, when the distance between the two conductive plates is formed to be one-half or less the wavelength of a signal in the dielectric medium layer, the signal being transmitted through the dielectric line, an NRD guide (nonradiative dielectric line) can be formed in which unnecessary radiation of transmission signals does not occur. Accordingly, more efficient signal transmission can be performed.

In order to ensure the nonradiative properties (confining effect of the dielectric strip), the difference in dielectric constant between the dielectric strip and the dielectric medium layer is important. In a general dielectric body, the dielectric constant has a predetermined value which is determined by the material thereof; hence, when the difference in dielectric constant is to be adjusted, a plurality of dielectric materials must be used. However, in the case of porous dielectrics, even when the identical material is used, the dielectric constant thereof depends on the porosity (the higher the porosity, the lower the dielectric constant); hence, by adjusting the porosity, the dielectric strip and the dielectric medium layers can be formed. The term "identical" substantially means that primary materials are identical with each other, and slight difference in component caused by different production conditions (drying condition and the like) is also included substantially in the scope of the "identical" (hereinafter, the above term is to be construed as described above). As described above, when the dielectric constant is adjusted by changing the porosity, the dielectric strip and the dielectric medium layers can be formed from one type of material, and hence the production can be easily performed (reduction in production cost). In addition to that described above, since the production can be performed using a patterning process, compared to the conventional case in which a three-dimensional structure is produced by machining or the like, the mass production can be suitably performed, and complicated shapes can also be produced. Furthermore, since the porosity can be freely determined, an optional dielectric constant can be realized. As a result, since dielectric strips having optional dielectric constants can be formed on one substrate (conductive plate), an NRD guide capable of responding to transmission signals having different frequencies can be formed on one substrate. (Heretofore, a plurality of dielectric materials which have different dielectric constants from each other is necessarily disposed, and in some cases, since a dielectric material having a desired dielectric constant was not present, an NRD guide responding to the frequency of a specific transmission signal could not be formed.) Accordingly, the degree of freedom of designing the NRD guide is significantly increased.

In addition, as a material for the dielectric strip and the dielectric medium layers, for example, an aerogel material may be mentioned.

In addition, the present invention also provides a method for producing the dielectric line described above. This is, the method is a method for producing a dielectric line having a dielectric strip provided between two conductive plates approximately parallel to each other and having a width smaller than that of the conductive plates, and dielectric medium layers filled between the conductive plates other than the dielectric strip and composed of a porous material having a dielectric constant smaller than that of the dielectric strip. The method described above has a film forming step of forming a film on one of the conductive plates using a dielectric raw material, a strip exposure step of exposing a part of the film of the dielectric raw material to predetermined light, beams, and vapor, the part having a shape corresponding to the dielectric strip, and a pore forming step of making the entire film of the dielectric raw material porous.

Accordingly, compared to the part which is processed by the exposure step, that is, to the part having a shape corresponding to the dielectric strip, the other parts which are not processed by the exposure process (that is, the parts corresponding to the dielectric medium layers) have a high porosity, and as a result, the dielectric strip and the dielectric medium layers can be formed so as to have well-balanced dielectric constants, that is what required as the dielectric line.

In the film formed in the film forming step described above, chemical bonds of the material itself are not substantially formed before the strip exposure step is performed, and hence the film is in an incomplete state. When the strip exposure step is performed for the film in the state described above, chemical reaction (polymerization reaction and the like) is facilitated in the exposed part as compared to that in the parts which are not exposed. Hence, the difference in density occurs between the part having a shape corresponding to the dielectric strip, which is processed by the strip exposure step, and the other parts (parts corresponding to the dielectric medium layers), and as a result, by the subsequent pore forming step, the difference in porosity occurs therebetween. This difference in porosity causes the difference in dielectric constant, and as a result, the dielectric line is formed. In addition, after the strip exposure step is performed, even when the chemical reaction (chemical bonding) of the entire film including the parts other than the dielectric strip is facilitated by heat treatment, the chemical reaction caused by the heat treatment is moderate as compared to that by the strip exposure step, and hence the difference in density also occurs between the part having a shape corresponding to the dielectric strip and the other parts.

In addition, unlike the conventional production method in which constituent elements are separately formed, followed by assembly thereof, production can be performed by patterning, and hence mass production of the dielectric lines is suitably performed.

As the strip exposure step described above, a step may be mentioned in which the part having a shape corresponding to the dielectric strip is exposed to ultraviolet rays, electron beams, X-rays, or ion beams, and in this case, the dielectric raw material may contain a photosensitive material. Alternatively, as the strip exposure step, a step may be mentioned in which the part having a shape corresponding to the dielectric strip is exposed to moisture vapor, vapor containing an acidic material, vapor containing a basic material, or vapor containing a dielectric raw material. By any one of the methods described above, the difference in porosity after the pore forming step can be obtained.

In addition, in the method for producing a dielectric line described above, the substantially identical material is used for the dielectric strip and the dielectric medium layers; however, the present invention is not limited thereto, and different materials may also be used in some cases.

For example, there is provided a method for producing a dielectric line having a dielectric strip provided between two conductive plates approximately parallel to each other and having a width smaller than that of the conductive plates, and dielectric medium layers filled between the conductive plates other than the dielectric strip and composed of a porous material having a dielectric constant smaller than that of the dielectric strip. The method described above has a first film forming step of forming a first film on one of the conductive plates using a first dielectric raw material, a film removing step of removing the first film except for a part having a shape corresponding to the dielectric strip, a second film forming step of forming a second film using a second dielectric raw material on said one of the two conductive plates which is processed by the film removing step, and a pore forming step of making porous the entire films of the first and the second dielectric raw materials.

Accordingly, after the first film of the first dielectric raw material is formed to have the shape of the dielectric strip in the first film forming step and the film removing step, the parts corresponding to the dielectric medium layers are formed by the second film of the second dielectric raw material in the second film forming step. By the production method described above, the dielectric line can also be formed.

In addition, as the film removing step, for example, there may be mentioned a step in which, in the first film of the first dielectric raw material, after the part having a shape corresponding to the dielectric strip is exposed to predetermined light or beams, followed by development treatment, the other parts other that the part having a shape corresponding to the dielectric strip are removed.

As described above, in the film formed in the above film forming step, chemical bonds are not substantially formed before the strip exposure step is performed, and the film is in an incomplete state. That is, since having a low molecular weight, the film is soluble in various solvents (organic solvents and alkaline solvents). Accordingly, after the part having a shape corresponding to the dielectric strip is exposed to the light or beams described above so as to facilitate the formation of chemical bonds, the parts other than the part (part exposed to the light or beams) having a shape corresponding to the dielectric strip can be selectively removed by development treatment.

In this case, when the first dielectric raw material contains a photosensitive material, it is preferable since the exposure effect to light or beams in the film removing step can be easily obtained.

Of course, light or beams having sufficient energy may be used in order to facilitate the chemical reaction (polymerization reaction) of molecules in the film; however, when the photosensitive material is used as described above, the exposure amount of light or beams can be reduced, and as a result, various advantages, such as decrease in time for treatment and easy treatment using a simple device, can be obtained.

In addition, as the photosensitive material, for example, a photo-acid generator may be mentioned.

As the dielectric raw material, for example, a raw material containing an organic metal material may be mentioned. As the organic metal material, a metal alkoxide may be mentioned by way of example.

In addition, as the dielectric raw material, a raw material containing a surfactant may also be mentioned.

As described above, when a surfactant is contained, surfactant micelles regularly disposed in a dielectric film are formed. By performing the pore forming step (that is, the step of removing the surfactant in the film) for the dielectric film as described above, pores regularly disposed are formed. As a result, the mechanical strength of a porous structure is enhanced, and hence the machinability of the film is improved.

In addition, as the pore forming step, for example, a step of exposing the dielectric raw material to a supercritical fluid may be mentioned.

As the pore forming step (the step of removing the surfactant in the film), for example, a step of exposing the film to an alcohol-based organic solvent having a high polarity may be mentioned; however, by the step of exposing the film to the supercritical fluid having a low surface tension, the supercritical fluid can be diffused into very fine areas, and as a result, the surfactant even in very fine areas can be effectively removed.

In the case described above, as the supercritical fluid, for example, carbon dioxide, ethanol, methanol, water, ammonia, and a fluorinated carbon material may be used alone or in combination.

Furthermore, when the pore forming step includes a step of performing heat treatment following the step of exposing the dielectric raw material to a supercritical fluid, the film quality can be stabilized.

In the case described above, for example, the heat treatment in the pore forming step may be performed at 200° C. or more.

Accordingly, for example, when the film is formed of a silica material (one example of a dielectric raw material), Si—O bonds are enhanced.

BEST MODE FOR CARRYING OUT THE INVENTION

Hereinafter, embodiment and examples of the present invention will be described in order to facilitate the understanding of the present invention. The following embodiment and examples of the present invention will be described by way of example, and it is naturally to be understood that the present invention is not limited thereto.

Figure 1:
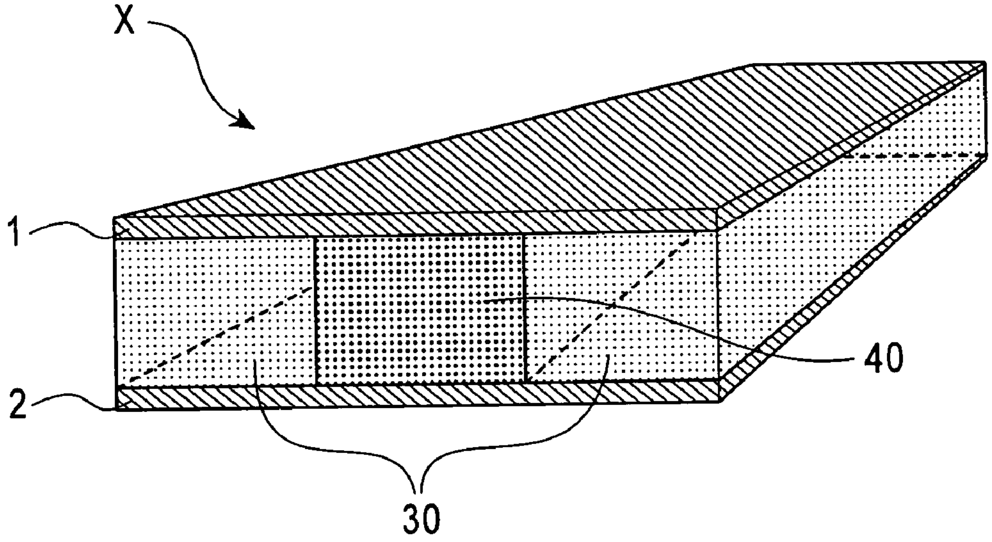
FIG. 1 is a perspective view showing the structure of a dielectric line X of an embodiment according to the present invention.
Figure 2:
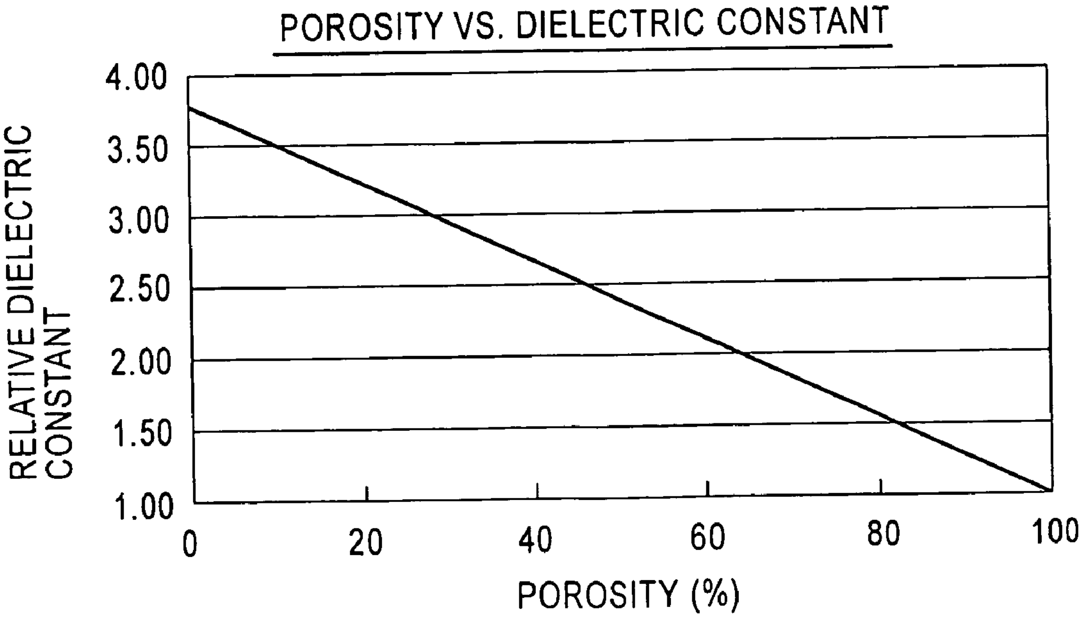
FIG. 2 is a graph showing the relationship between the porosity and the relative dielectric constant of a porous material.
Figure 3:
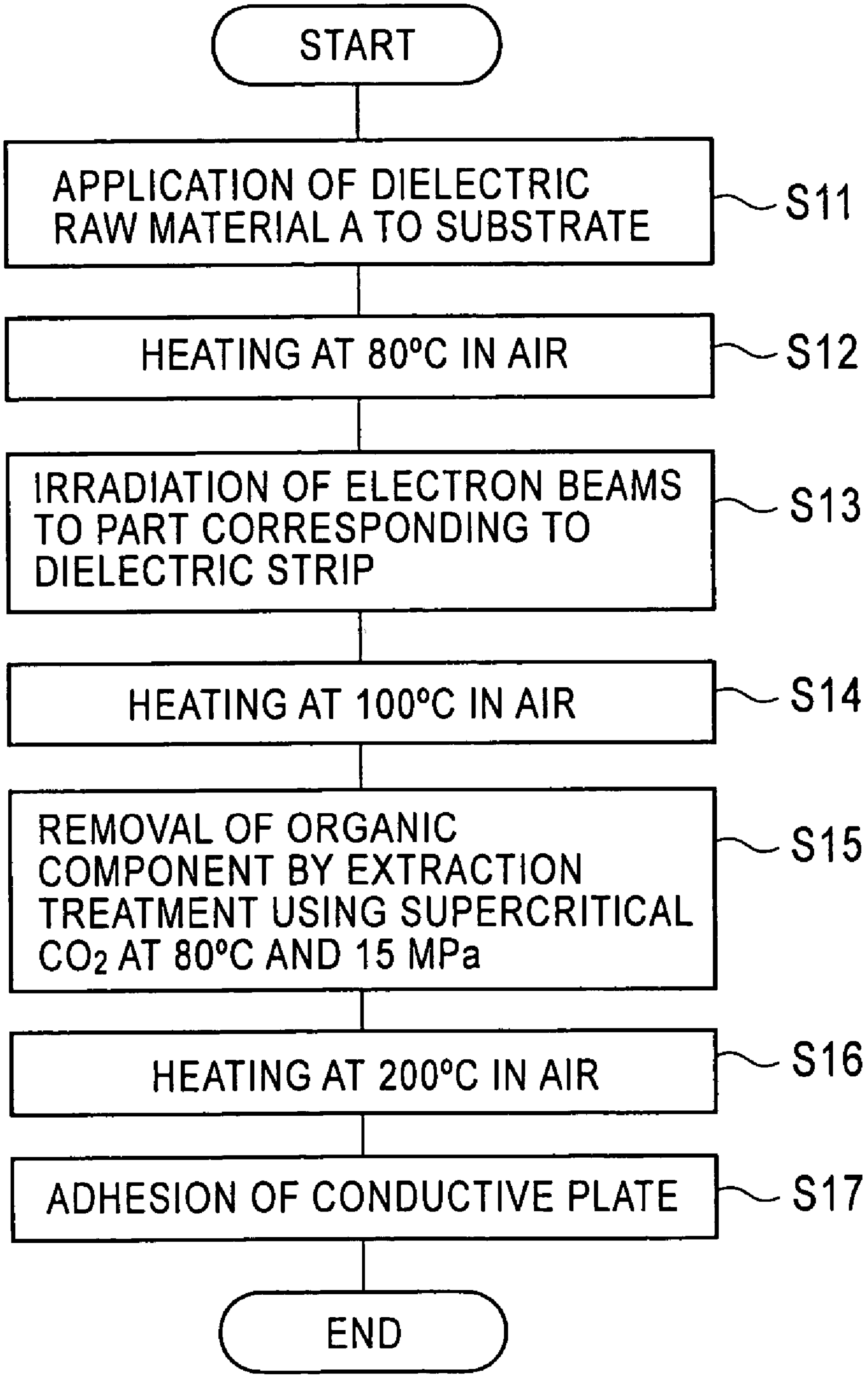
FIG. 3 is a flowchart showing the procedure of a production method of the dielectric line X of an embodiment according to the present invention.
Figure 4:
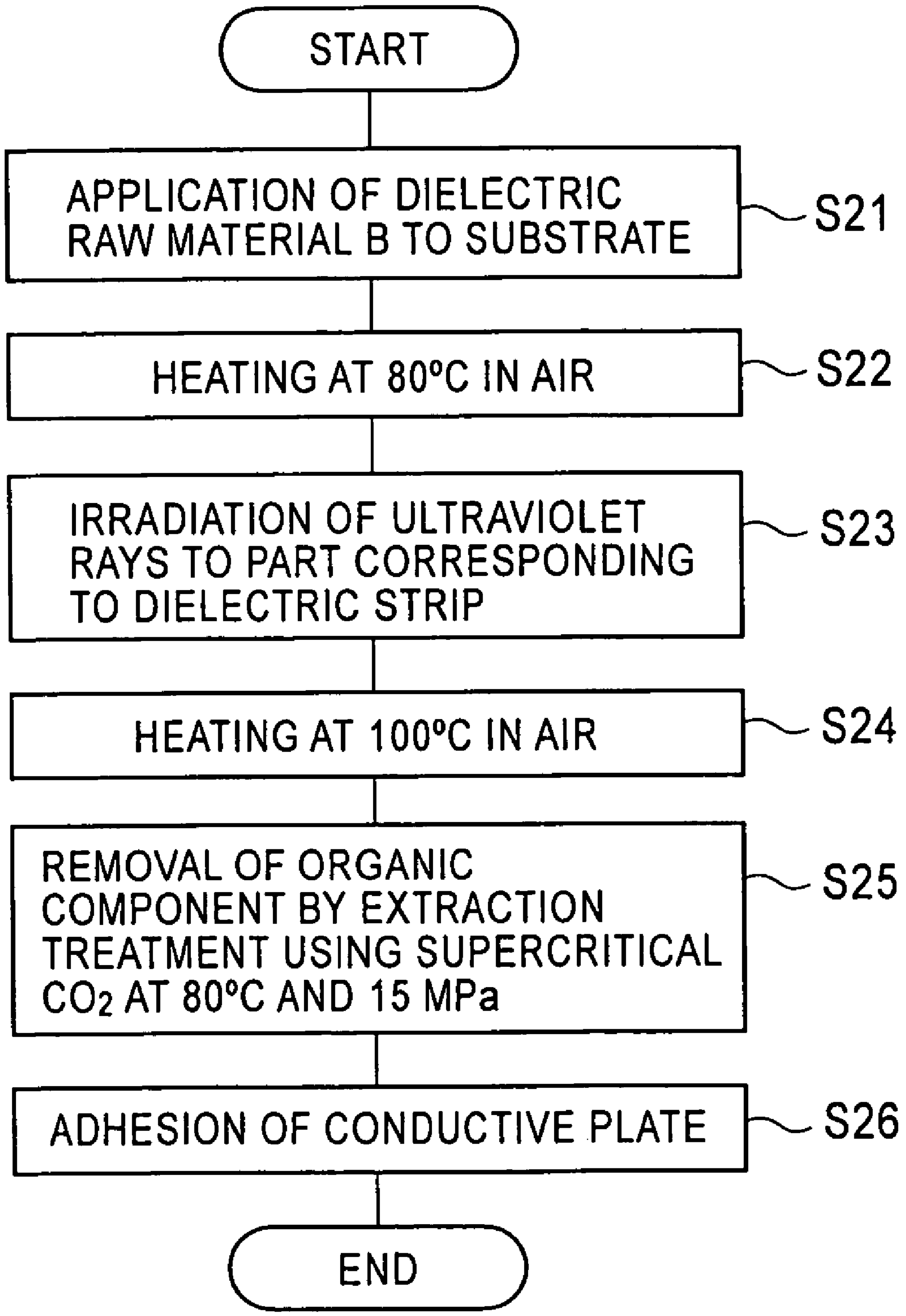
FIG. 4 is a flowchart showing the procedure of a production method of the dielectric line X of a first example according to the present invention.
Figure 5:
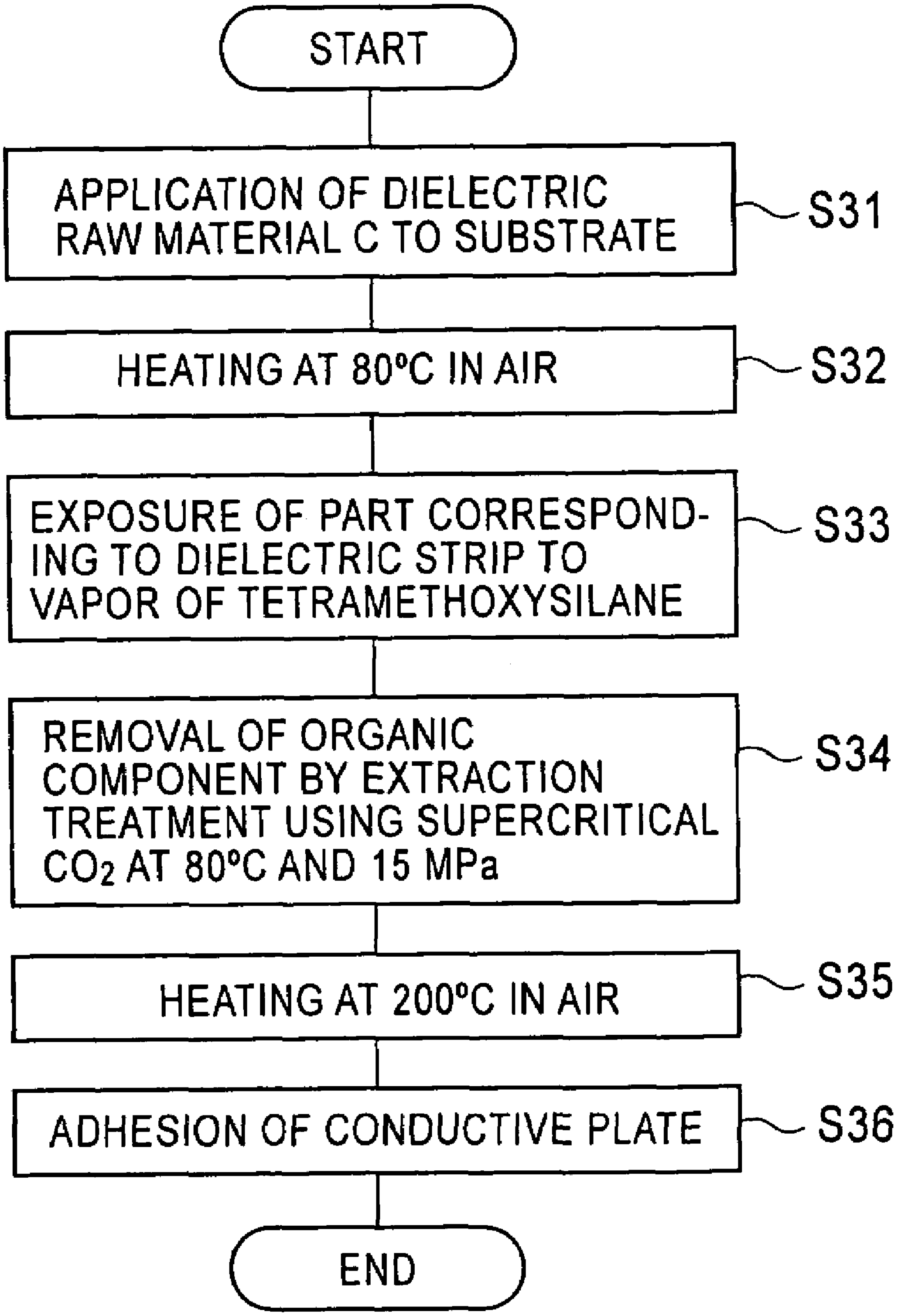
FIG. 5 is a flowchart showing the procedure of a production method of the dielectric line X of a second example according to the present invention.
Figure 6:
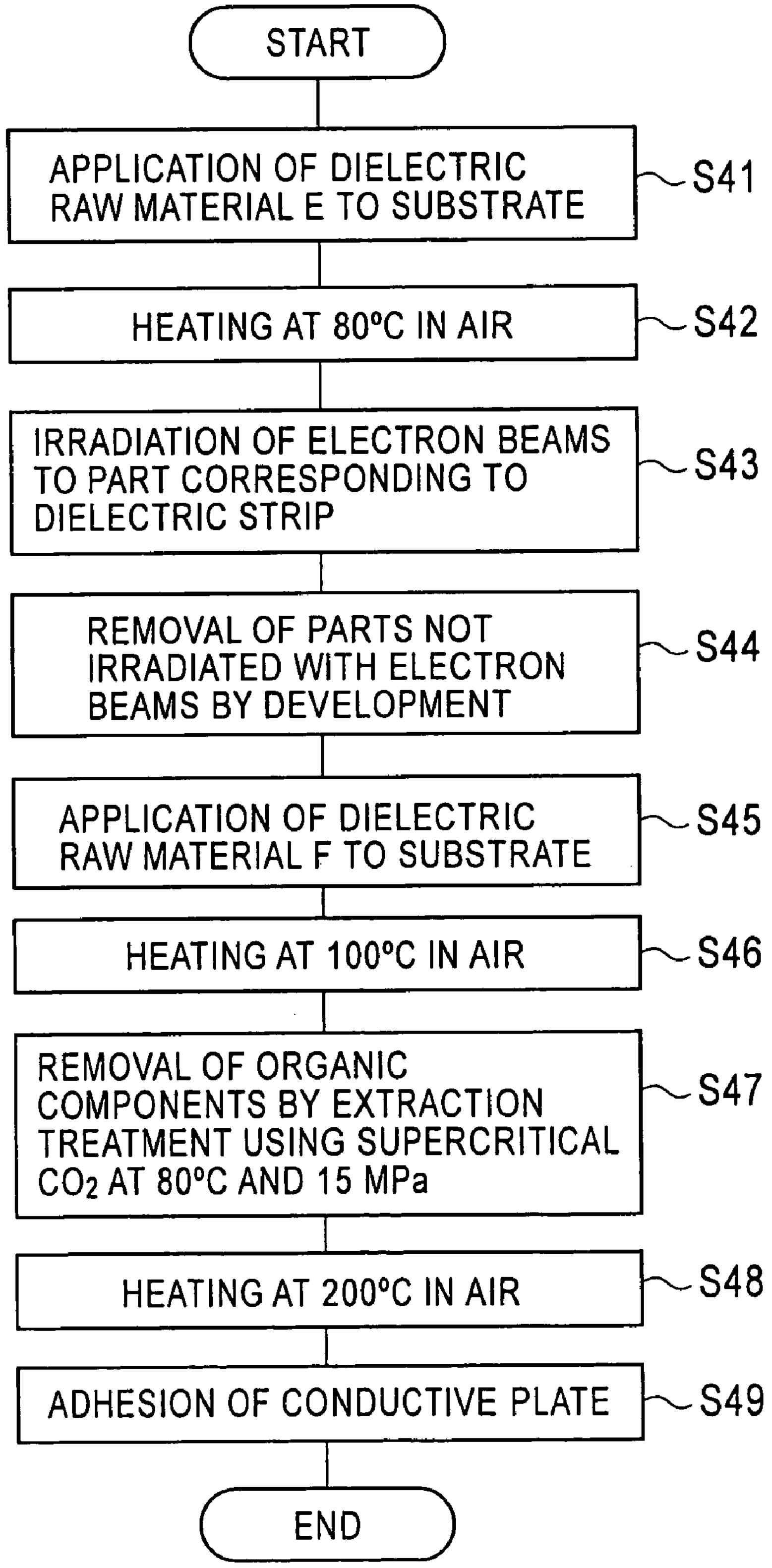
FIG. 6 is a flowchart showing the procedure of a production method of the dielectric line X of a third example according to the present invention.

In this embodiment, FIG. 1 is a perspective view showing the structure of a dielectric line X of an embodiment according to the present invention; FIG. 2 is a graph showing the relationship between the porosity and the relative dielectric constant of a porous material; FIG. 3 is a flowchart showing the procedure of a production method of the dielectric line X of an embodiment according to the present invention; FIG. 4 is a flowchart showing the procedure of a production method of the dielectric line X of a first example according to the present invention; FIG. 5 is a flowchart showing the procedure of a production method of the dielectric line X of a second example according to the present invention; FIG. 6 is a flowchart showing the procedure of a production method of the dielectric line X of a third example according to the present invention; and FIG. 7 is a perspective view showing the structure of a conventional general NRD guide.

First, referring to FIG. 1, the structure of the dielectric line X of the embodiment according to the present invention will be described.

As shown in FIG. 1, the dielectric line X has the structure composed of two conductive plates 1 and 2 and a dielectric strip 40 which is provided therebetween and which has a width smaller than that of the conductive plates 1 and 2, and the structure described above is the same as that of the conventional dielectric line (NRD guide) shown in FIG. 7; however, the points different therefrom are as follows. That is, the dielectric strip 40 is formed of a porous material, and parts which are between the conductive plates 1 and 2 other than the dielectric strip 40 are filled with dielectric medium layers 30 composed of a porous material having a dielectric constant smaller than that of the dielectric strip 40.

Figure 7:
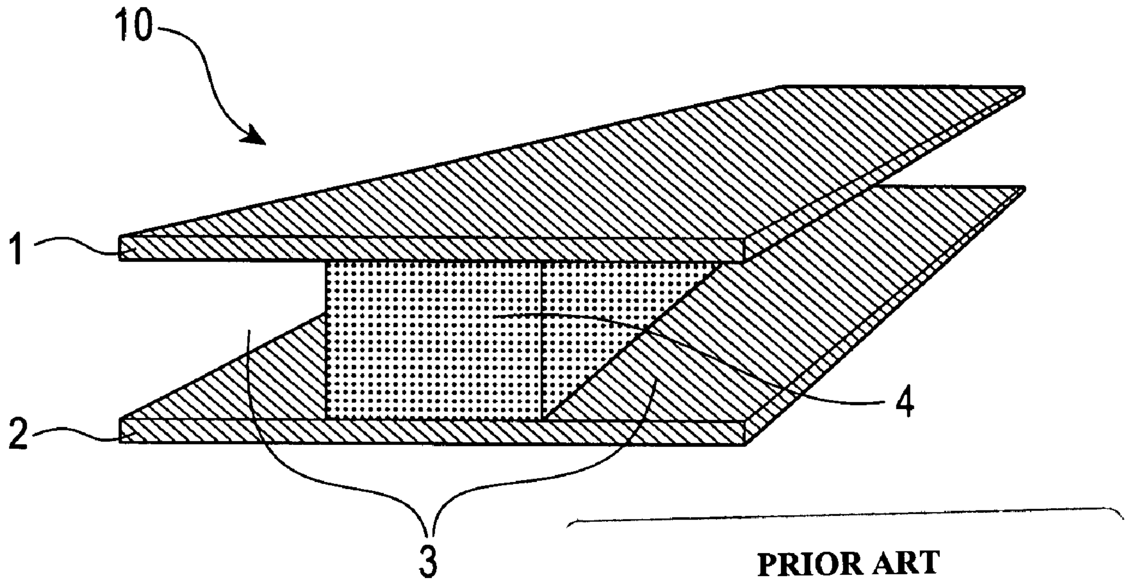
FIG. 7 is a perspective view showing the structure of a conventional general NRD guide.

Since the dielectric strip 40 and the dielectric medium layers 30 are filled between the two conductive plates 1 and 2 as described above, compared to the dielectric line which has been primarily used (shown in FIG. 7, in which the parts other than the dielectric strip are voids (air)), the displacement of the dielectric strip 40 is unlikely to occur, and the strength is significantly enhanced to form a stable structure.

In addition, since the porous materials are used for the dielectric strip 40 and the dielectric medium layers 30, by increasing the porosity thereof, the dielectric constant and the dielectric loss can be considerably decreased, and as a result, high frequency signals can be transmitted with very high transmission efficiency (low loss). Furthermore, by optionally selecting the porosity of the porous material, a desired dielectric constant can be realized (see FIG. 2), and hence the degree of freedom of designing is significantly increased.

FIG. 2 is a graph showing the relationship between the porosity and the dielectric constant of a dielectric film formed of a metal alkoxide (tetramethoxysilane) as a raw material, the dielectric film being one example of a porous material. As shown in FIG. 2, it is understood that as the porosity is increased, the relative dielectric constant linearly approaches 1.00. That is, when the porosity of the porous material is infinitely increased to 100%, properties (relative dielectric constant and dielectric loss) can be obtained which are infinitely close to the properties of air.

In addition, the distance between the two conductive plates 1 and 2 (that is, the thickness of the dielectric strip 40 and that of the dielectric medium layers 30) is formed to be one-half or less the wavelength of a signal in the dielectric medium layer 30, the signal being transmitted through this dielectric line X. Hence, the dielectric line X forms an NRD guide (nonradiative dielectric line) in which unnecessary radiation of transmission signals does not occur. Accordingly, efficient signal transmission having no radiation loss can be performed.

Next, referring to the flowchart shown in FIG. 3, one example of a production method of the dielectric line X shown in FIG. 1 will be described. Hereinafter, S11, S12, . . . each indicate the ordinal number of a process step (step).

First, a dielectric raw material A, which is a predetermined dielectric raw material, is applied to a substrate which is the conductive plate 1, one of the two conductive plates described above, so as to have a predetermined thickness (S11). This thickness is one-half or less the wavelength of a signal in the dielectric medium layer 30, the signal being transmitted through the dielectric line X.

The dielectric raw material A is a solution prepared by the following procedure. That is, after 2 g of tetramethoxysilane (metal alkoxide) $Si(CH_3O)_4$, which is one example of an organic metal compound), 10 g of ethanol, 2 g of butanol, 1 g of methyl 3-methoxypropionate, and 1.2 g of water at a pH of 3 are mixed and stirred, the mixture thus prepared is held at 60° C. for approximately 6 hours for facilitating reaction thereof to form a solution, a transparent solution is then prepared by mixing the above solution with IBCF (manufactured by Sanwa Chemical Co., Ltd.), which is a photo-acid generator, at a ratio of 0.05% (percent by weight), and subsequently, 0.2 g of hexadecyltrimethylammonium chloride (one example of a surfactant) is mixed with 10 cc of the above solution, followed by stirring.

Next, a part coated with the dielectric raw material A described above is dried by heating (baking) at 80° C. in the air, so that the film of the dielectric raw material A is formed (S12). This heating is performed for a sufficient period of time (such as approximately 1 to 5 minutes) to remove an excess solvent (necessary for coating but unnecessary thereafter) such as ethanol contained in the raw material solution and to stabilize the film on the substrate by increasing the viscosity of the film. In this embodiment, S11 and S12 are one example of the film forming step.

Subsequently, only a part of the film of the above dielectric raw material A, which has a shape corresponds to the dielectric strip 40, is irradiated with electron beams (that is, the part having a shape corresponding to the dielectric strip 40 is exposed to electron beams) (S13). As the electron beams, for example, electron beams at an acceleration voltage of 50 keV and a dose of 10 $\mu C/cm^2$ are used.

Accordingly, Si—OH bonds formed from tetramethoxysilane are formed into Si—O bonds (a so-called crosslinking reaction).

That is, the film formed before the irradiation of electron beams has not an ideal silica structure and still has many unreacted portions (in particular, Si—OH bonds). When the film in the state described above is irradiated with electron beams, the unreacted portions thereof are cross-linked, and as a result, the bones as the silica can be progressively strengthened. In addition, at the same time, micelle structures formed by the surfactant are destroyed. That is, since the micelle structures are destroyed, and the crosslinking reaction progresses, a higher dense structure can be formed.

Next, heating (baking) is performed for the film of the dielectric raw material A at 100° C. in the air (S14). This step is a step of facilitating a crosslinking reaction of the parts which are not irradiated with electron beams and is performed, for example, for approximately 1 to 5 minutes.

Next, by using supercritical $CO_2$ (one example of the supercritical fluid) at 80° C. and 15 MPa, extraction treatment is performed for hexadecyltrimethylammonium chloride which is a surfactant, so that the organic component (surfactant) remaining in the film of the dielectric raw material is removed by supercritical extraction (S15).

In this step, for example, after the dielectric raw material is charged into a predetermined pressure container, followed by introduction of $CO_2$ which is not in a supercritical state into the pressure container, the temperature and/or the pressure is increased, so that the $CO_2$ is placed in a supercritical state. Alternatively, a fluid in a supercritical state may be charged into a pressure container in which the dielectric material is placed.

Next, the dielectric raw material processed by the extraction treatment described above is heated to 200° C. in the air (S16). This heating is performed, for example, for approximately 5 to 30 minutes. In this embodiment, S15 and S16 are one example of the above pore forming step.

Through the steps described above, in the layer of the dielectric raw material A, since parts at which the organic component was previously present and was already removed are formed into pores, a layer made of a porous material is formed on the substrate (that is, one of the two conductive plates, the conductive plate 1). In addition, compared to the part irradiated with electron beams (that is, the part corresponding to the dielectric strip 40), the other parts (that is, the parts corresponding to the dielectric medium layers 30) have a high porosity. When the relative dielectric constants of the layers of the porous materials formed by the steps described above were measured, the relative dielectric constant of the part irradiated with electron beams (that is, the part corresponding to the dielectric strip 40) was 2.0, and the relative dielectric constant of the other parts (that is, the parts corresponding to the dielectric medium layers 30) was 1.5. As described above, the dielectric strip 40 and the dielectric medium layers 30 are formed so as to have well-balanced dielectric constants, that is what required as the dielectric line. The dielectric strip 40 and the dielectric medium layers 30 formed in this embodiment are aerogel materials (dry aerogel materials) having different porosities.

Onto the dielectric strip 40 and the dielectric medium layers 30 thus formed, the other conductive plate 2 is adhered (S17), and hence the dielectric line X can be formed.

According to the production method described above, unlike the conventional production method in which constituent elements are separately formed, followed by assembly thereof, production can be performed by patterning, and hence the method described above can be suitably used for mass production.

In addition, in Step 13, instead of the irradiation of electron beams described above, when irradiation of X-rays (for example, having an electron energy of 1 GeV) or irradiation of ion beams (such as $Be^{2+}$ irradiation at an energy of 200 keV and at an ion dose of $1e^{13}$ to $1e^{14}/cm^2$) is performed, a similar result can also be obtained.

As the supercritical fluid used for the extraction treatment in S15, a mixture containing two or more materials may be used, in which at least one of the above two or more materials may be selected from the group consisting of carbon dioxide, ethanol, methanol, water, ammonia, and a fluorinated carbon material.

Besides the materials mentioned above, a solvent may also be added in order to improve the performance of the extraction treatment. As the solvent to be used in this case, in view of compatibility with $CO_2$, an organic solvent is preferably used. As usable organic solvents, for example, alcohol-based solvents, ketone-based solvents, and amide-based solvents may be mentioned.

As particular alcohol-based solvents, for example, methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, and 2-ethylbutanol may be mentioned.

As particular ketone-based solvents, for example, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, and di-n-butyl ketone may be mentioned.

As amide-based solvents, for example, formamide, N-methylformamide, N,N'-dimethylformamide, N-ethylformamide, N,N'-diethylformamide, acetoamide, N-methylacetoamide, N,N'-dimethylacetoamide, N-ethylacetoamide, N,N'-diethylacetoamide, N-methylpropionamide, and N-methyl pyrrolidone may be mentioned.

As the surfactants mentioned above, generally known materials such as nonionic surfactants and cationic surfactants may be used. As the nonionic surfactants, for example, ethylene oxide derivatives and propylene oxide derivatives may be used.

As the cationic surfactants, for example, quaternary ammonium salts of an alkyl group having 8 to 24 carbon atoms, such as $C_nH_{2n+1}(CH_3)_3N$+X—, $C_nH_{2n+1}(C_2H_5)_3N$+X— (X indicates an element to be turned into a negative ion), $C_nH_{2n+1}NH_2$, and $H_2N(CH_2)_nNH_2$ may be mentioned.

In addition, besides the materials mentioned above, there may be mentioned so-called gemini surfactants which have a plurality of hydrophilic groups and a plurality of hydrophobic groups in one molecular, such as $C_nH_{2n+1}X_2N$+M—$(CH_3)_5$ N+M—$X_2C_mH_{2m+1}$ (n, m=5 to 20). In the structure described above, X indicates an anion (in particular, $Cl^-$, $Br^-$, or the like), and M indicates a hydrogen atom or a lower alkyl group (in particular, $CH_3$, $C_2H_5$, or the like).

The surfactants mentioned above may be used alone or in combination.

As the dielectric raw material, an inorganic material is superior in terms of heat stability, processability, and mechanical strength. For example, oxides of titanium, silicon, aluminum, boron, germanium, lanthanum, magnesium, niobium, phosphorous, tantalum, tin, vanadium, and zirconium may be mentioned. Among those, when metal alkoxides of the above metals are used as the raw materials, in the film forming step, the mixing with the surfactants can be preferably performed. As particular metal alkoxides, for example, there may be mentioned tetraethoxytitanium, tetraisopropoxytitanium, tetramethoxytitanium, tetra-n-butoxytitanium, tetraethoxysilane, tetraisopropoxysilane, tetramethoxysilane, tetra-n-butoxysilane, triethoxyfluorosilane, triethoxysilane, triisopropoxyfluorosilane, trimethoxyfluorosilane, tirmethoxysilane, tri-n-butoxyfluorosilane, tri-n-propoxyfluorosilane, trimethylmethoxysilane, trimethylethoxysilane, trimethychlorosilane, phenyltriethoxysilane, phenyldiethoxychlorosilane, methyltrimethoxysilane, methyltriethoxysilane, ethyltriethoxysilane, dimethyldimethoxysilane, dimethyldiethoxysilane, trismethoxyethoxyvinylsilane, triethoxyaluminum, triisobutoxyaluminum, triisopropoxyaluminum, trimethoxyaluminum, tri-n-butoxyaluminum, tri-n-propoxyaluminum, tri-sec-butoxyaluminum, tri-tert-butoxyaluminum, triethoxyboron, triisobutoxyboron, triisopropoxyboron, trimethoxyboron, tri-n-butoxyboron, tri-sec-butoxyboron, tetraethoxygermanium, tetraisopropoxylgermanium, tetramethoxygermanium, tetra-n-butoxygermanium, trismethoxyethoxylanthanum, bismethoxyethoxymagnesium, pentaethoxyniobium, pentaisopropoxyniobium, pentamethoxyniobium, penta-n-butoxyniobium, penta-n-propoxyniobium, triethylphosphate, triethylphosphite, triisopropoxyphosphate, triisopropoxyphosphite, trimethylphosphate, trimethylphosphite, tri-n-butylphosphate, tri-n-butylphosphite, tri-n-propylphosphate, tri-n-propylphosphite, pentaethoxytantalum, pentaisopropoxytantalum, pentamethoxytantalum, tetra-tert-butoxytin, tin acetate, triisopropoxy-n-butyltin, triethoxyvanadyl, tri-n-propoxyoxyvanadyl, trisacetylacetonatovanadium, tetraisopropoxyzirconium, tetra-n-butoxyzirconium, and tetra-tert-butoxyzirconium. Among those mentioned above, tetraisopropoxytitanium, tetra-n-butoxytitanium, tetraethoxysilane, tetraisopropoxysilane, tetramethoxysilane, tetra-n-butoxysilane, triisobutoxyaluminum, and trisisopropoxyaluminum may be mentioned as preferable materials by way of example. Those metal alkoxides may be used alone or in combination. As the inorganic materials, a material primarily composed of silica is preferably used since a layer having a low dielectric constant can be obtained.

Hereinafter, with reference to particular examples, superior effects of the present invention will be described.

EXAMPLE 1

Next, referring to the flowchart shown in FIG. 4, a first example of a method for producing the dielectric line X shown in FIG. 1 will be described.

First, a dielectric raw material B, which was a predetermined dielectric raw material, was applied to a substrate which was the conductive plate 1, one of the two conductive plates described above, so as to have a predetermined thickness (S21).

The dielectric raw material B was prepared by the following procedure. After 2 g of tetramethoxysilane (metal alkoxide) $Si(CH_3O)_4$, which was one example of an organic metal material, 10 g of ethanol, 2 g of butanol, 1 g of methyl 3-methoxypropionate, and 1.2 g of water at a pH of 3 were mixed and stirred, the mixture thus prepared was held at 60° C. for approximately 6 hours for facilitating reaction thereof to form a solution, a transparent solution was then prepared by mixing the above solution with IBCF (manufactured by Sanwa Chemical Co., Ltd.), which was a photo-acid generator, at a ratio of 0.05% (percent by weight), and subsequently, 0.2 g of hexadecyltrimethylammonium chloride (one example of a surfactant) was mixed whit 10 cc of the above transparent solution, followed by stirring. Next, the solution thus prepared was processed by heating (baking) at 200° C., thereby forming the dielectric raw material B.

Next, a part coated with the dielectric raw material B described above was dried by heating (baking) at 80° C. in the air, so that the film of the dielectric raw material B was formed (S22). This heating was performed for a sufficient period of time (such as approximately 1 to 5 minutes) to stabilize the film on the substrate by increasing the viscosity of the film. In this example, S21 and S22 are one example of the film forming step.

Subsequently, only a part of the film of the above dielectric raw material B, which had a shape corresponding to the dielectric strip 40, was irradiated with ultraviolet rays (that is, the part having a shape corresponding to the dielectric strip 40 was exposed to ultraviolet rays) (S23).

Accordingly, Si—O bonds were formed by a crosslinking reaction.

Next, heating (baking) was performed for the film of the dielectric raw material B at 100° C. in the air (S24). This step was a step of also facilitating a crosslinking reaction of parts which were not irradiated with ultraviolet rays and was performed, for example, for approximately 1 to 5 minutes.

Next, by using supercritical $CO_2$ (one example of the supercritical fluid) at 80° C. and 15 MPa, extraction treatment was performed for hexadecyltrimethylammonium chloride which was a surfactant, so that the organic component remaining in the film of the dielectric raw material was removed (S25, one example of the pore forming step).

Onto the dielectric strip 40 and the dielectric medium years 30 thus formed, the other conductive plate 2 was adhered (S26), so that the dielectric line X could be formed.

Through the steps described above, compared to the part irradiated with ultraviolet rays (that is, the part corresponding to the dielectric strip 40), the other parts (that is, the parts corresponding to the dielectric medium layers 30) had a high porosity. When the relative dielectric constants of the layers of the porous materials formed by the steps described above were measured, the relative dielectric constant of the part corresponding to the dielectric strip 40 was 2.0, and the relative dielectric constant of the other parts (that is, the parts corresponding to the dielectric medium layers 30) was 1.5.

EXAMPLE 2

Next, referring to the flowchart shown in FIG. 5, a second example of a method for producing the dielectric line X shown in FIG. 1 will be described.

First, a dielectric raw material C, which was a predetermined dielectric raw material, was applied to a substrate which was one of the two conductor plates described above, the conductive plate 1, so as to have a predetermined thickness (S31).

The dielectric raw material C was a solution prepared by the following procedure. After 2 g of tetramethoxysilane (metal alkoxide) $Si(CH_3O)_4$, which was one example of an organic metal material, 10 g of ethanol, 2 g of butanol, 1 g of methyl 3-methoxypropionate, and 1.2 g of water at a pH of 3 were mixed and stirred, the mixture thus prepared was held at 60° C. for approximately 6 hours for facilitating reaction thereof so as to prepare a transparent solution, and 10 cc of this solution was mixed with 0.2 g of hexadecyltrimethylammonium chloride (one example of a surfactant), followed by stirring.

Next, a part coated with the dielectric raw material C described above was dried by heating (baking) at 80° C. in the air, so that the film of the dielectric raw material C was formed (S32). This heating was performed for a sufficient period of time (such as approximately 1 to 5 minutes) to stabilize the film on the substrate by increasing the viscosity of the film. In this example, S31 and S32 are one example of the film forming step.

Subsequently, only a part of the film of the above dielectric raw material C, which had a shape corresponding to the dielectric strip 40, was exposed to vapor (S33). In this step, for example, the part described above was exposed to vapor through a mask provided with a window (opening) having a shape corresponding to the dielectric strip 40, so that the other part other than the part having a shape corresponding to the dielectric strip 40 was not exposed to vapor.

Accordingly, Si—O bonds were formed by a crosslinking reaction.

Next, after the mask was removed, by using supercritical $CO_2$ (one example of the supercritical fluid) at 80° C. and 15 MPa, extraction treatment was performed for hexadecyltrimethylammonium chloride which was a surfactant, so that the organic component remaining in the film of the dielectric raw material was removed (S34), and heating was further performed at 200° C. in the air (S35). This heating was performed, for example, for approximately 5 to 30 minutes. In this example, Steps 34 and 35 are one example of the pore forming step.

Onto the dielectric strip 40 and the dielectric medium layers 30 thus formed, the other conductive plate 2 was adhered (S36), so that the dielectric line X could be formed.

Through the steps described above, compared to the part exposed to vapor (that is, the part corresponding to the dielectric strip 40), the other parts (that is, the parts corresponding to the dielectric medium layers 30) had a high porosity. When the relative dielectric constants of the layers of the porous materials formed by the steps described above were measured, the relative dielectric constant of the part corresponding to the dielectric strip 40 was 2.0, and the relative dielectric constant of the other parts (that is, the parts corresponding to the dielectric medium layers 30) was 1.5.

In addition, in Step 33, instead of the exposure to vapor of tetraethoxysilane, for example, by exposure to vapor of silicon alkoxide such as tetramethoxysilane, exposure to moisture vapor (such as moisture vapor at 100° C. and 1 atmospheric pressure), exposure to vapor of another acidic material (such as vapor of a saturated aqueous hydrochloric acid solution at 23° C. and 1 atmospheric pressure), exposure to vapor of a basic material (such as vapor of a saturated aqueous ammonium solution at 23° C. and 1 atmospheric pressure), a result similar to that described above can be obtained.

EXAMPLE 3

Next, referring to the flowchart shown in FIG. 6, a third example of a method for producing the dielectric line X shown in FIG. 1 will be described.

First, a dielectric raw material E, which was a predetermined dielectric raw material, was applied to a substrate which was one of the two conductive plates, the conductor plate 1, so as to have a predetermined thickness (S41).

The dielectric raw material E was a solution prepared by the following procedure. After 2 g of tetramethoxysilane (metal alkoxide) $Si(CH_3O)_4$, which was one example of an organic metal material, 10 g of ethanol, 2 g of butanol, 1 g of methyl 3-methoxypropionate, and 1.2 g of water at a pH of 3 were mixed and stirred, the mixture thus prepared was held at 60° C. for approximately 6 hours for facilitating reaction thereof to form a solution, a transparent solution D was then prepared by mixing the above solution with IBCF (manufactured by Sanwa Chemical Co., Ltd.), which was a photo-acid generator, at a ratio of 0.05% (percent by weight), and subsequently, 0.2 g of alkyltrimethylammonium chloride $CH_3(CH_2)_nN(CH_3)_3Cl$ (in which n=12 was satisfied) (one example of a surfactant) was mixed with 10 cc of the above transparent solution D, followed by stirring.

Next, a part coated with the dielectric raw material E described above was dried by heating (baking) at 80° C. in the air, so that the film of the dielectric raw material E was formed (S42). This heating was performed for a sufficient period of time (such as approximately 1 to 5 minutes) to stabilize the film on the substrate by increasing the viscosity of the film. In this example, S41 and S42 are one example of the first film forming step.

Subsequently, only a part of the film of the above dielectric raw material E, which had a shape corresponding to the dielectric strip 40, was irradiated with electron beams (that is, the part having a shape corresponding to the dielectric strip 40 was exposed to electron beams) (S43) as described in the embodiment. The amount of irradiation of electron beams was 10 μC/cm$^2$.

Accordingly, Si—O bonds were formed by a crosslinking reaction.

Next, for the film of the dielectric raw material E, development treatment using a solvent such as an organic solvent or an alkaline solution (such as an aqueous solution of tetramethylammonium hydroxide) was performed (one example of the film removing step). By this treatment, in the film of the dielectric raw material E, non-irradiated parts in which chemical bonds were not formed (that is, the parts other than the part having a shape corresponding to the dielectric strip) were selectively removed.

Subsequently, a dielectric raw material F, which was a predetermined dielectric raw material, was applied onto the parts of the substrate so as to have a predetermined thickness (S45), the parts being areas at which the film on the substrate was removed.

The dielectric raw material F was a solution prepared by mixing and stirring 10 cc of the solution D and 0.2 g of alkyltrimethylammonium chloride $CH_3(CH_2)_nN(CH_3)_3Cl$ (in which n=16 was satisfied) (one example of a surfactant).

Next, heating (baking) was performed for the film of the dielectric raw material F at 100° C. in the air (S46). This step was a step of facilitating a crosslinking reaction of the dielectric raw material F and was performed, for example, for approximately 1 to 5 minutes.

Next, by using supercritical $CO_2$ (one example of the supercritical fluid) at 80° C. and 15 MPa, extraction treatment was performed for alkyltrimethylammonium chloride which was a surfactant, so that the organic components remaining in the films (the entire films) of the dielectric raw materials E and F were removed (S47). After this extraction treatment, heating was further performed at 200° C. in the air (S48). This heating was performed, for example, for approximately 5 to 30 minutes. In this example, S47 and S48 are one example of the pore forming step.

Onto the dielectric strip 40 and the dielectric medium layers 30 thus formed, the other conductive plate 2 was adhered (S49), so that the dielectric line X could be formed.

Through the steps described above, compared to a film portion (that is, the part corresponding to the dielectric strip 40) of the dielectric material E, film portions (that is, the parts corresponding to the dielectric medium layers 30) of the dielectric raw material F also had a high porosity. When the relative dielectric constants of the layers of the porous materials formed by the steps described above were measured, the relative dielectric constant of the part corresponding to the dielectric strip 40 was 2.0, and the relative dielectric constant of the other parts (that is, the parts corresponding to the dielectric medium layers 30) was 1.5.

In addition, except that the amount of irradiation of electron beams was set to 5 μC/cm$^2$, a dielectric line was formed by the same method and conditions as described above. In the case described above, the parts corresponding to the dielectric medium layers 30 had a relative) dielectric constant of 1.8. As described above, by changing the amount of irradiation of electron beams, the relative dielectric constant of the parts corresponding to the dielectric medium layers 30 can be adjusted to an optional value.

In addition, by using a surfactant (alkyltrimethylammonium chloride) in which n=14 was satisfied, a dielectric line was formed by the same method and conditions as described above. In the case described above, the parts corresponding to the dielectric medium layers 30 had a relative dielectric constant of 1.8. As described above, the dielectric constant of the parts corresponding to the dielectric medium layers 30 can be changed.

INDUSTRIAL APPLICABILITY

As has thus been described, according to the present invention, since the space between the two conductive plates is filled with the dielectric strip and the dielectric medium layers, compare to the conventional dielectric line in which parts other than the dielectric strip are composed of voids (air), the dielectric strip is not likely to be displaced, and the strength is significantly improved to form a stable structure.

In addition, since the porous materials are used for the dielectric strip and the dielectric medium layers, by increasing the porosity thereof, the dielectric constant and the dielectric loss can be significantly decreased. As a result, high frequency signals can be transmitted with very high transmission efficiency (low loss).

In addition, according to the present invention, since being formed of the substantially identical porous material by adjusting the porosity thereof, the dielectric strip and the dielectric medium layers can be formed from one type of material, and hence the production can be easily performed (reduction in production cost). In addition, since the production can be performed using a patterning process, compared to the conventional case in which a three-dimensional structure is produced by machining, the mass production can be suitably performed, and complicated shapes can also be easily produced. Furthermore, a plurality of dielectric strips having optional dielectric constants can be formed on one substrate (conductive plate), and hence an NRD guide capable of responding transmission signals having different frequencies can be formed on one substrate. As a result, the degree of freedom of designing an NRD guide is significantly increased.

The invention claimed is:

1. A method for producing a dielectric line having a dielectric strip provided between two conductive plates approximately parallel to each other and having a width smaller than that of the conductive plates, and dielectric medium layers filled between the conductive plates other than the dielectric strip and composed of a porous material having a dielectric constant smaller than that of the dielectric strip, the method comprising:

a film forming step of forming a film on one of the conductive plates using a dielectric raw material;

a strip exposure step of exposing a part of the film of the dielectric raw material to predetermined light, beams, or vapor, the part having a shape corresponding to the dielectric strip; and then a pore forming step of making the entire film of the dielectric raw material porous, wherein porosity of the exposed part of the film is greater than porosity of an unexposed part of the film.

2. The method for producing a dielectric line, according to claim 1, wherein the strip exposure step is a step of exposing the part having a shape corresponding to the dielectric strip to ultraviolet rays, electron beams, X-rays, or ion beams, and the dielectric raw material comprises a photosensitive material.

3. The method for producing a dielectric line, according to claim 2, wherein the photosensitive material comprises a photo-acid generator.

4. The method for producing a dielectric line, according to claim 1, wherein the dielectric raw material comprises an organic metal material.

5. The method for producing a dielectric line, according to claim 4, wherein the organic metal material comprises a metal alkoxide.

6. The method for producing a dielectric line, according to claim 1, wherein the dielectric raw material comprises a surfactant.

7. A method for producing a dielectric line having a dielectric strip provided between two conductive plates approximately parallel to each other and having a width smaller than that of the conductive plates, and dielectric medium layers filled between the conductive plates other than the dielectric strip and composed of a porous material having a dielectric constant smaller than that of the dielectric strip, the method comprising:

a first film forming step of forming a first film using a first dielectric raw material on one of the conductive plates;

a film removing step of removing a part of the first film, a remaining part of the first film having a shape corresponding to the dielectric strip;

a second film forming step of forming a second film using a second dielectric raw material in a space from which the part of the first film was removed; and then a pore forming step of making porous the entire films of the first dielectric raw material and the second dielectric raw material, wherein porosity of the first film is greater than porosity of the second film.

8. The method for producing a dielectric line, according to claim 7, wherein the film removing step comprises exposing the part of the first film of the first dielectric raw material to predetermined light or beams, the part having a shape corresponding to the dielectric strip, and then performing development treatment to remove the first film other than the part having a shape corresponding to the dielectric strip.

9. The method for producing a dielectric line, according to claim 7, wherein the first dielectric raw material comprises a photosensitive material.

10. The method for producing a dielectric line, according to claim 9, wherein the photosensitive material comprises a photo-acid generator.

11. The method for producing a dielectric line, according to claim 7, wherein the dielectric raw material comprises an organic metal material.

12. The method for producing a dielectric line, according to claim 11, wherein the organic metal material comprises a metal alkoxide.

13. The method for producing a dielectric line, according to claim 7, wherein the dielectric raw material comprises a surfactant.

* * * * *